United States Patent
Cho (10) Patent No.: US 8,917,119 B2
(45) Date of Patent: Dec. 23, 2014

(54) OUTPUT DRIVING CIRCUIT CAPABLE OF DECREASING NOISE, AND SEMICONDUCTOR MEMORY DEVICE INCLUDING THE SAME

(71) Applicant: Samsung Electronics Co., Ltd., Suwon-si (KR)

(72) Inventor: Young Chul Cho, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 80 days.

(21) Appl. No.: 13/747,710

(22) Filed: Jan. 23, 2013

(65) Prior Publication Data

US 2013/0235675 A1  Sep. 12, 2013

Related U.S. Application Data (60) Provisional application No. 61/609,510, filed on Mar. 12, 2012.

(30) Foreign Application Priority Data

Apr. 10, 2012 (KR) ........................ 10-2012-0037482

(51) Int. Cl.
*H03B 1/00* (2006.01)
*G11C 7/02* (2006.01)
*G11C 7/10* (2006.01)
*H03K 17/56* (2006.01)
*H03K 19/0185* (2006.01)

(52) U.S. Cl.
CPC .. *G11C 7/02* (2013.01); *G11C 7/10* (2013.01); *H03K 17/56* (2013.01); *G11C 7/1057* (2013.01); *H03K 19/0185* (2013.01)
USPC ........................................................ 327/108

(58) Field of Classification Search
USPC ........................................................ 327/108
See application file for complete search history.

(56) References Cited

U.S. PATENT DOCUMENTS

| | | | |
|---|---|---|---|
| 4,956,691 A * | 9/1990 | Culley et al. ................... | 257/369 |
| 5,281,869 A | 1/1994 | Lundberg | |
| 5,701,136 A | 12/1997 | Huq et al. | |
| 6,307,399 B1 * | 10/2001 | Lien et al. ........................ | 326/83 |
| 2007/0024328 A1 * | 2/2007 | Shin .............................. | 327/112 |
| 2011/0234257 A1 | 9/2011 | Kwon et al. | |

FOREIGN PATENT DOCUMENTS

| | | |
|---|---|---|
| JP | 2000-357745 | 12/2000 |
| JP | 2007-166159 | 6/2007 |

* cited by examiner

*Primary Examiner* — Hoai V Ho
(74) *Attorney, Agent, or Firm* — Muir Patent Consulting, PLLC (57) ABSTRACT

An output driving circuit includes a first pull-up transistor, a first pull-down transistor and a second pull-down transistor. The first pull-up transistor is configured to generate a first output signal at the output node in response to a first control signal. The first pull-down transistor is configured to generate a second output signal at the output node in response to a second control signal. The second pull-down transistor is configured to connect the output node to the first ground voltage in response to a third control signal. The memory device including the output driving circuit may be insensitive to noise and may have little data transmission error.

4 Claims, 10 Drawing Sheets

FIG. 14

US 8,917,119 B2

OUTPUT DRIVING CIRCUIT CAPABLE OF DECREASING NOISE, AND SEMICONDUCTOR MEMORY DEVICE INCLUDING THE SAME

CROSS-REFERENCE TO RELATED APPLICATION

This application claims the benefit of provisional U.S. Application No. 61/609,510 filed on Mar. 12, 2012, and also claims priority under 35 U.S.C. §119 to Korean Patent Application No. 10-2012-0037482 filed on Apr. 10, 2012, the entire contents of each of which are incorporated herein by reference in their entirety.

BACKGROUND

Various example embodiments relate to a semiconductor memory device, and particularly, to a semiconductor memory device including an output driving circuit capable of decreasing noise.

In a semiconductor memory device, noise may be included in a data output signal during a transmission of the data. Research into precise transmission of data without transmission error due to the noise is being conducted.

SUMMARY

Embodiments of the present disclosure provide an output driving circuit capable of decreasing noise of an output signal.

Embodiments of the present disclosure also provide a semiconductor memory device including the output driving circuit.

In accordance with one embodiment, an output driving circuit includes a first buffer, a second buffer, a pull-up transistor, a pull-down transistor and a noise canceller.

The first buffer may generate a first control signal, and output the first control signal at a first node in response to a first input signal. The second buffer may generate a second control signal at a second node in response to a second input signal having an opposite phase of the first input signal. The pull-up transistor may be configured to generate a first output signal at an output node, and electrically connect a supply voltage to the output node in response to the first control signal. The pull-down transistor may be configured to generate a second output signal at the output node, and electrically connect a ground voltage to the output node in response to the second control signal. The noise canceller may be configured to form a current path between the output node and the ground voltage to decrease noise of the first output signal when the pull-up transistor is in an on state and the pull-down transistor is in an off state. The noise canceller may be electrically connected to the first node, the second node and the output node.

In accordance with another embodiment, a semiconductor memory device includes a memory cell array, an address input buffer, a row decoder, a column decoder, an input/output (I/O) sense amplifier and an output circuit.

The memory cell array is configured to operate in response to a word line enable signal and a column selecting signal. The address input buffer is configured to generate a row address signal and a column address signal based on an external address. The row decoder is configured to decode the row address signal and to generate the word line enable signal, and the column decoder is configured to decode the column address signal and to generate the column selecting signal.

The I/O sense amplifier is configured to amplify data output from the memory cell array and to generate first data, and transfer data received from an exterior to the memory cell array.

The output circuit includes a pull-up transistor and a pull-down transistor, and is configured to generate an output signal at an output node based on the first data, and form a current path between the output node and a ground voltage to decrease noise of the output signal when the pull-up transistor is in an on state and the pull-down transistor is in an off state.

In accordance with another embodiment, an output driving circuit includes a first pull-up transistor, a first pull-down transistor, and a second pull-down transistor.

The first pull-up transistor is connected between a first power supply voltage and an output node, and configured to generate a first output signal at the output node in response to a first control signal. The pull-down transistor is connected between a first ground voltage and the output node, and configured to generate a second output signal at the output node in response to a second control signal. The output driving circuit is configured so that the second pull-down transistor is in an on state when either the first pull-up transistor or the first pull-down transistor is in an on state.

The output driving circuit according to disclosed embodiments may decrease power noise and may improve integrity of an output signal by forming a current path between the output node and the ground voltage when the pull-up transistor is in an on state and the pull-down transistor is in an off state. Accordingly, a semiconductor memory device including the output driving circuit according to example embodiments may be insensitive to noise and may have little data transmission error.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Various example embodiments will now be described more fully with reference to the accompanying drawings in which some embodiments are shown. The present disclosure may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms, such as "comprises" and/or "comprising," or "includes" and/or "including" when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
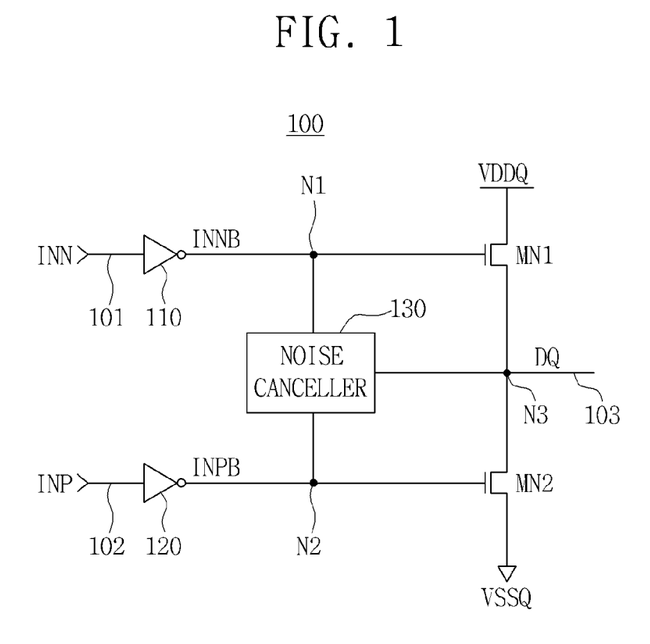
FIG. 1 is a circuit diagram of an output driving circuit in accordance with one embodiment.

FIG. 1 is a circuit diagram of an output driving circuit 100 in accordance with one embodiment.

Referring to FIG. 1, the output driving circuit 100 may include a first buffer 110, a second buffer 120, a pull-up NMOS transistor MN1, a pull-down NMOS transistor MN2 and a noise canceller 130.

The first buffer 110 may receive a first input signal INN through an input line 101, and buffer the first input signal INN to generate a first control signal INNB, and output the first control signal INNB to a first node N1. The second buffer 120 may receive a second input signal INP having an opposite phase of the first input signal INN through an input line 102, buffer the second input signal INP to generate a second control signal INPB, and output the second control signal INPB to a second node N2. For example, the first buffer 110 may include an inverter, and may invert a phase of the first input signal INN to generate the first control signal INNB. The second buffer 120 may include an inverter, and may invert a phase of the second input signal INP to generate the second control signal INPB.

The pull-up NMOS transistor MN1 may electrically connect a supply voltage VDDQ to an output node N3 in response to the first control signal INNB. The supply voltage VDDQ may be the same as or different from a supply voltage supplied to the first buffer 110. For example, the supply voltage VDDQ may be smaller than the supply voltage supplied to the first buffer 110. The pull-down NMOS transistor MN2 may electrically connect a ground voltage VSSQ to the output node N3 in response to the second control signal INPB. The ground voltage VSSQ may be the same as or different from a ground voltage supplied to the second buffer 120. For example, the ground voltage VSSQ may be connected to or separated from the ground voltage supplied to the first buffer 120. The noise canceller 130 may form a current path between the output node N3 and the ground voltage VSSQ to decrease noise of an output signal DQ when the pull-up NMOS transistor MN1 is in an on state and the pull-down NMOS transistor MN2 is in an off state. The noise canceller 130 may be electrically connected to the first node N1, the second node N2, and the output node N3. The output signal DQ may be output to an exterior through an output line 103.

In one embodiment, the pull-up NMOS transistor MN1 may have a lower threshold voltage than the pull-down NMOS transistor.

Figure 2:
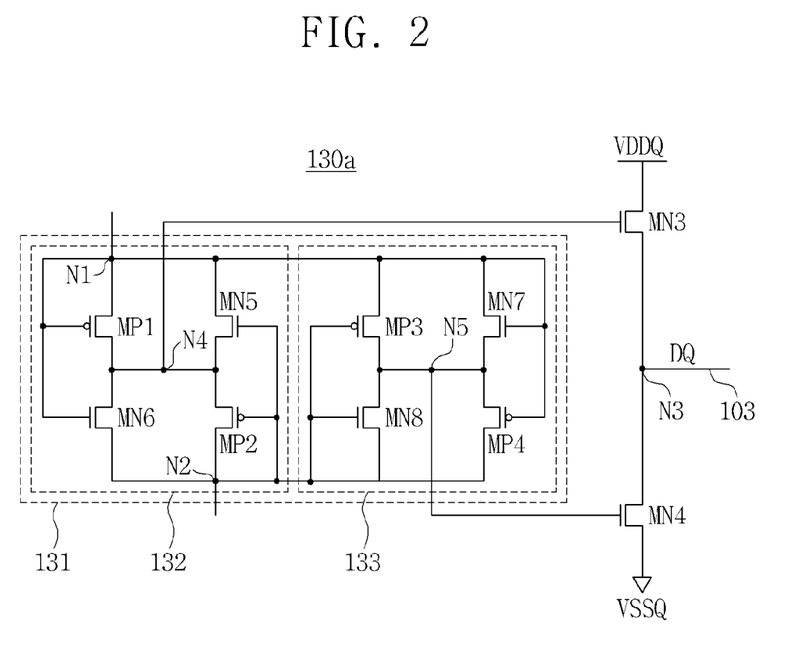
FIG. 2 is a circuit diagram illustrating an exemplary noise canceller included in the output driving circuit of FIG. 1, in accordance with one embodiment.

FIG. 2 is a circuit diagram illustrating an exemplary noise canceller 130 included in the output driving circuit 100 of FIG. 1, in accordance with one embodiment.

Referring to FIG. 2, the noise canceller 130a may include an auxiliary pull-up NMOS transistor MN3, an auxiliary pull-down NMOS transistor MN4 and a driving control circuit 131. The driving control circuit 131 includes a first driving control circuit 132 and a second driving control circuit 133.

The auxiliary pull-up NMOS transistor MN3 may have a drain connected to the supply voltage VDDQ and a source connected to the output node N3. The auxiliary pull-down NMOS transistor MN4 may have a source connected to the ground voltage VSSQ and a drain connected to the output node N3. The first driving control circuit 132 may control the auxiliary pull-up NMOS transistor MN3, and may be electrically connected to the first node N1 and the second node N2. The second driving control circuit 133 may control the auxiliary pull-down NMOS transistor MN4, and may be electrically connected to the first node N1 and the second node N2.

In one embodiment, the auxiliary pull-up NMOS transistor MN3 may have a lower threshold voltage than that of the auxiliary pull-down NMOS transistor MN4.

In one embodiment, a driving capability of the auxiliary pull-down NMOS transistor MN4 is smaller than a driving capability of the pull-down NMOS transistor MN2. For example, the driving capability of the auxiliary pull-down NMOS transistor MN4 may be smaller than 10% of the driving capability of the pull-down NMOS transistor MN2.

In one embodiment, the ratio of the magnitude of a current flowing through the pull-down NMOS transistor MN2 when the pull-down NMOS transistor MN2 is in an on state and a current flowing through the auxiliary pull-down NMOS transistor MN4 when the pull-up NMOS transistor MN1 is in an on state, may be greater than 1:1. For example, in one embodiment, the ratio is greater than 10:1, 20:1, or 30:1 (e.g., the ratio may be 97:3).

In one embodiment, the size of the auxiliary pull-down NMOS transistor MN4 is smaller than the size of the pull-down NMOS transistor MN2. For example, hereinafter, the size may refer to width/length (W/L) that indicates the driving capability or current capability of a transistor.

The first driving control circuit 132 may include a first PMOS transistor MP1, a first NMOS transistor MN6, a second PMOS transistor MP2 and a second NMOS transistor MN5.

The first PMOS transistor MP1 may have a drain and a gate commonly connected to the first node N1, and a source connected to a gate of the auxiliary pull-up NMOS transistor MN3. The first NMOS transistor MN6 may have a gate connected to the first node N1, a source connected to the second node N2, and a drain connected to the gate of the auxiliary pull-up NMOS transistor MN3. The second PMOS transistor MP2 may have a drain and a gate commonly connected to the second node N2, and a source connected to the gate of the auxiliary pull-up NMOS transistor MN3. The second NMOS transistor MN5 may have a source connected to the first node N1, a gate connected to the second node N2, and a drain connected to the gate of the auxiliary pull-up NMOS transistor MN3. The first PMOS transistor MP1, the first NMOS transistor MN6, the second PMOS transistor MP2, the second NMOS transistor MN5 and the auxiliary pull-up NMOS transistor MN3 may be connected to a fourth node N4.

The second driving control circuit 133 may include a third PMOS transistor MP3, a third NMOS transistor MN8, a fourth PMOS transistor MP4 and a fourth NMOS transistor MN7.

The third PMOS transistor MP3 may have a source connected to the first node N1, a gate connected to the second node N2, and a drain connected to a gate of the auxiliary pull-down NMOS transistor MN4. The third NMOS transistor MN8 may have a gate and a drain commonly connected to the second node N2, and a source connected to the gate of the auxiliary pull-down NMOS transistor MN4. The fourth PMOS transistor MP4 may have a source connected to the second node N2, a gate connected to the first node N1, and a drain connected to the gate of the auxiliary pull-down NMOS transistor MN4. The fourth NMOS transistor MN7 may have a drain and a gate commonly connected to the first node N1, and a source connected to the gate of the auxiliary pull-down NMOS transistor MN4. The third PMOS transistor MP3, the third NMOS transistor MN8, the fourth PMOS transistor MP4, the fourth NMOS transistor MN7 and the auxiliary pull-down NMOS transistor MN4 may be connected to a fifth node N5.

Figure 3:
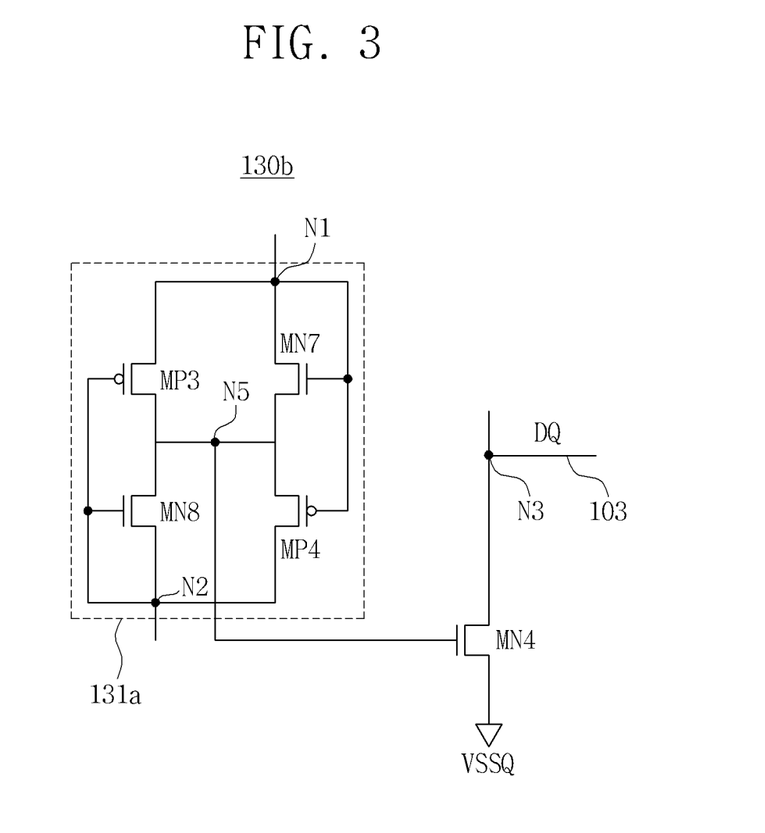
FIG. 3 is a circuit diagram illustrating another exemplary noise canceller included in the output driving circuit of FIG. 1, in accordance with another embodiment.

FIG. 3 is a circuit diagram illustrating another exemplary noise canceller 130 included in the output driving circuit 100 of FIG. 1, in accordance with another embodiment.

Referring to FIG. 3, the noise canceller 130b may include an auxiliary pull-down NMOS transistor MN4 and a driving control circuit 131a.

The auxiliary pull-down NMOS transistor MN4 may have a source connected to the ground voltage VSSQ and a drain connected to the output node N3. The driving control circuit 131a may control the auxiliary pull-down NMOS transistor MN4, and may be electrically connected to the first node N1 and the second node N2.

The driving control circuit 131a may include a third PMOS transistor MP3, a third NMOS transistor MN8, a fourth PMOS transistor MP4 and a fourth NMOS transistor MN7.

The third PMOS transistor MP3 may have a source connected to the first node N1, a gate connected to the second node N2, and a drain connected to a gate of the auxiliary pull-down NMOS transistor MN4. The third NMOS transistor MN8 may have a gate and a drain commonly connected to the second node N2, and a source connected to the gate of the auxiliary pull-down NMOS transistor MN4. The fourth PMOS transistor MP4 may have a source connected to the second node N2, a gate connected to the first node N1, and a drain connected to the gate of the auxiliary pull-down NMOS transistor MN4. The fourth NMOS transistor MN7 may have a drain and a gate commonly connected to the first node N1, and a source connected to the gate of the auxiliary pull-down NMOS transistor MN4.

Hereinafter, the operation of the output driving circuit 100 will be described referring to FIGS. 1 to 3.

When the first input signal INN is in a logic low state, and the second input signal INP is in a logic high state, the first control signal INNB, which is a voltage of the first node N1, goes into a logic high state, and the second control signal INPB, which is a voltage of the second node N2, goes into a logic low state. Therefore, the pull-up NMOS transistor MN1 is turned on, the pull-down NMOS transistor MN2 is turned off, and the supply voltage VDDQ is connected to the output node N3. Then, the output signal DQ goes into a logic high state.

Referring to FIG. 2, when a voltage of the first node N1 is in a logic high state and a voltage of the second node N2 is in a logic low state, the first PMOS transistor MP1 and the second NMOS transistor MN5 of the first driving control circuit 132 are in an off state, and the second PMOS transistor MP2 and the first NMOS transistor MN6 of the first driving control circuit 132 are in an on state. Accordingly, the auxiliary pull-up NMOS transistor MN3 is in an off state in response to a control signal of the second node N2 which is in a logic low state. Further, when a voltage of the first node N1 is in a logic high state and a voltage of the second node N2 is in a logic low state, the fourth PMOS transistor MP4 and the third NMOS transistor MN8 of the second driving control circuit 133 are in an off state, and the third PMOS transistor MP3 and the fourth NMOS transistor MN7 of the second driving control circuit 133 are in an on state. Accordingly, the voltage of the first node N1 which is in a logic high state is transferred to the fifth node N5, and the auxiliary pull-down NMOS transistor MN4 is in an on state in response to a control signal of the fifth node N5.

Alternatively, when the first input signal INN is in a logic high state, and the second input signal INP is in a logic low state, the first control signal INNB, which is a voltage of the first node N1, goes into a logic low state, and the second control signal INPB, which is a voltage of the second node N2, goes into a logic high state. Therefore, the pull-up NMOS transistor MN1 is turned off, the pull-down NMOS transistor MN2 is turned on, and the ground voltage VSSQ is connected to the output node N3. Accordingly, the output signal DQ goes into a logic low state.

When a voltage of the first node N1 is in a logic low state and a voltage of the second node N2 is in a logic high state, the first PMOS transistor MP1 and the second NMOS transistor MN5 of the first driving control circuit 132 are in an on state, and the second PMOS transistor MP2 and the first NMOS transistor MN6 of the first driving control circuit 132 are in an off state. Accordingly, the auxiliary pull-up NMOS transistor MN3 is in an off state in response to a control signal of the first node N1 which is in a logic low state. Further, when a voltage of the first node N1 is in a logic low state and a voltage of the second node N2 is in a logic high state, the fourth PMOS transistor MP4 and the third NMOS transistor MN8 of the second driving control circuit 133 are in an on state, and the third PMOS transistor MP3 and the fourth NMOS transistor MN7 of the second driving control circuit 133 are in an off state. Accordingly, the voltage of the second node N2 which is in a logic high state is transferred to the fifth node N5, and the auxiliary pull-down NMOS transistor MN4 is in an on state in response to a control signal of the fifth node N5.

As described above, when the pull-up NMOS transistor MN1 is in an on state and the pull-down NMOS transistor MN2 is in an off state, the auxiliary pull-up NMOS transistor MN3 is in an off state, and the auxiliary pull-down NMOS transistor MN4 is in an on state. Therefore, when the pull-up NMOS transistor MN1 is turned on, and the supply voltage VDDQ is connected to the output node N3, the auxiliary pull-down NMOS transistor MN4 is in an on state and a current path may be formed between the output node N3 and the ground voltage VSSQ. Accordingly, noise of the output signal DQ may be decreased and signal integrity of the output signal DQ may be improved.

Further, when the pull-up NMOS transistor MN1 is in an off state and the pull-down NMOS transistor MN2 is in an on state, the auxiliary pull-up NMOS transistor MN3 is in an off state, and the auxiliary pull-down NMOS transistor MN4 is in an on state.

As described hereinafter, the size of the auxiliary pull-down NMOS transistor MN4 is much smaller than the size of the pull-down NMOS transistor MN2, and therefore the state of the output signal DQ may not vary according to the state of the auxiliary pull-down NMOS transistor MN4.

Figure 4:
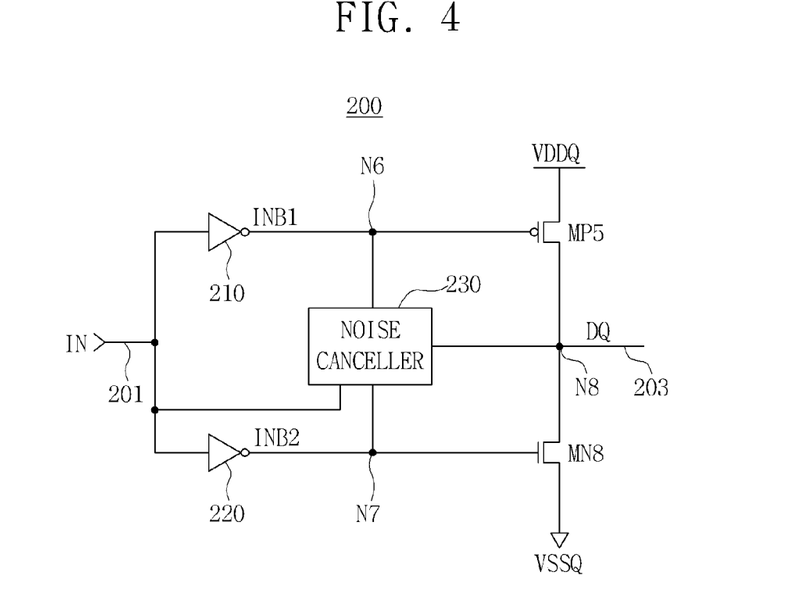
FIG. 4 is a circuit diagram of an output driving circuit in accordance with another embodiment.

FIG. 4 is a circuit diagram of an output driving circuit 200 in accordance with another embodiment.

Referring to FIG. 4, the output driving circuit 200 may include a first buffer 210, a second buffer 220, a pull-up PMOS transistor MP5, a pull-down NMOS transistor MN8 and a noise canceller 230.

The first buffer 210 may receive a first input signal INN through a common input line 201, buffer a first input signal IN to generate a first control signal INB1, and output the first control signal INB1 to a first node N6. The second buffer 220 may buffer the first input signal IN to generate a second control signal INB2, and output the second control signal INB2 to a second node N7. For example, the first buffer 210 may include an inverter, and may invert a phase of the first input signal IN to generate the first control signal INB1. The second buffer 220 may include an inverter, and may invert a phase of the first input signal IN to generate the second control signal INB2.

The pull-up PMOS transistor MP5 may electrically connect a supply voltage VDDQ to an output node N8 in response to the first control signal INB1 of the first node N6. The pull-down NMOS transistor MN8 may electrically connect a ground voltage VSSQ to the output node N8 in response to the second control signal INB2 of the second node N7. The noise canceller 230 may form a current path between the output node N8 and the ground voltage VSSQ to decrease noise of an output signal DQ when the pull-up PMOS transistor MP5 is in an on state and the pull-down NMOS transistor MN8 is in an off state. The noise canceller 230 may be electrically connected to the common input line 201, the first node N6, the second node N7 and the output node N8. The output signal DQ may be output to an exterior through an output line 203.

Figure 5:
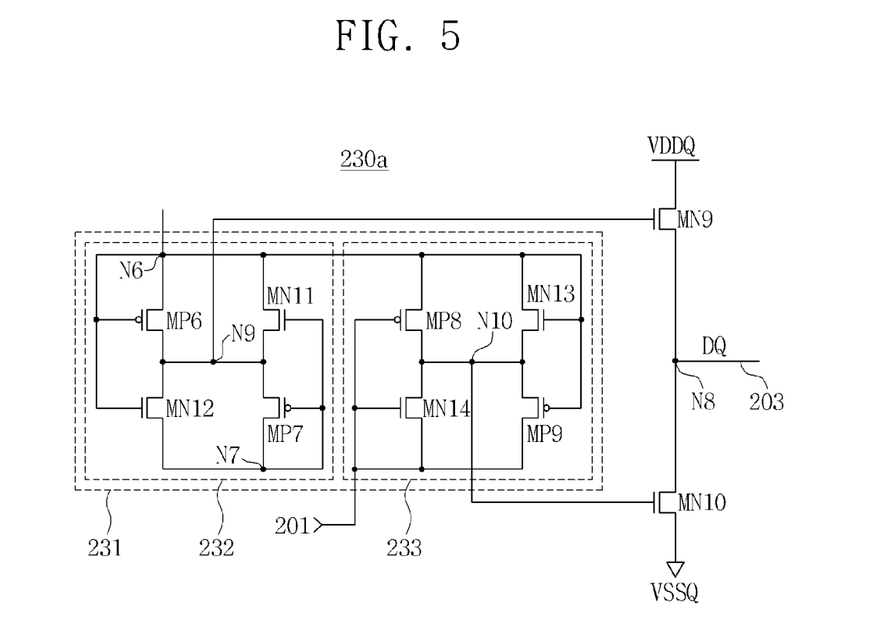
FIG. 5 is a circuit diagram illustrating a noise canceller included in the output driving circuit of FIG. 4, in accordance with one embodiment.

FIG. 5 is a circuit diagram illustrating an exemplary noise canceller 230 included in the output driving circuit 200 of FIG. 4, in accordance with an embodiment.

Referring to FIG. 5, the noise canceller 230a may include an auxiliary pull-up NMOS transistor MN9, an auxiliary pull-down NMOS transistor MN10 and a driving control circuit 231. The driving control circuit 231 includes a first driving control circuit 232 and a second driving control circuit 233.

The auxiliary pull-up NMOS transistor MN9 may have a drain connected to the supply voltage VDDQ and a source connected to the output node N8. The auxiliary pull-down NMOS transistor MN10 may have a source connected to the ground voltage VSSQ and a drain connected to the output node N8. The first driving control circuit 232 may control the auxiliary pull-up NMOS transistor MN9, and may be electrically connected to the first node N6 and the second node N7. The second driving control circuit 233 may control the auxiliary pull-down NMOS transistor MN10, and may be electrically connected to the first node N6 and the common input line 201.

In one embodiment, the auxiliary pull-up NMOS transistor MN9 may have a lower threshold voltage than that of the auxiliary pull-down NMOS transistor MN10.

In one embodiment, a driving capability of the auxiliary pull-down NMOS transistor MN10 is smaller than a driving capability of the pull-down NMOS transistor MN8. For example, the driving capability of the auxiliary pull-down NMOS transistor MN10 may be smaller than 10% of the driving capability of the pull-down NMOS transistor MN8.

In one embodiment, the ratio of the magnitude of a current flowing through the pull-down NMOS transistor MN8 when the pull-down NMOS transistor MN8 is in an on state and a current flowing through the auxiliary pull-down NMOS transistor MN10 when the pull-up PMOS transistor MP5 is in an on state, may be greater than 1:1. For example, in one embodiment, the ratio is greater than 10:1, 20:1, or 30:1 (e.g., the ratio may be 97:3).

In one embodiment, the size of the auxiliary pull-down NMOS transistor MN10 is smaller than the size of the pull-down NMOS transistor MN8.

The first driving control circuit 232 may include a first PMOS transistor MP6, a first NMOS transistor MN12, a second PMOS transistor MP7 and a second NMOS transistor MN11.

The first PMOS transistor MP6 may have a drain and a gate commonly connected to the first node N6, and a source connected to a gate of the auxiliary pull-up NMOS transistor MN9. The first NMOS transistor MN12 may have a gate connected to the first node N6, a drain connected to the second node N7, and a source connected to the gate of the auxiliary pull-up NMOS transistor MN9. The second PMOS transistor MP7 may have a drain and a gate commonly connected to the second node N7, and a source connected to the gate of the auxiliary pull-up NMOS transistor MN9. The second NMOS transistor MN11 may have a drain connected to the first node N6, a gate connected to the second node N7, and a source connected to the gate of the auxiliary pull-up NMOS transistor MN9. The first PMOS transistor MP6, the first NMOS transistor MN12, the second PMOS transistor MP7, the second NMOS transistor MN11 and the auxiliary pull-up NMOS transistor MN9 may be connected to a fourth node N9.

The second driving control circuit 233 may include a third PMOS transistor MP8, a third NMOS transistor MN14, a fourth PMOS transistor MP9 and a fourth NMOS transistor MN13.

The third PMOS transistor MP8 may have a source connected to the first node N6, a gate connected to the common input line 201, and a drain connected to a gate of the auxiliary pull-down NMOS transistor MN10. The third NMOS transistor MN14 may have a gate and a drain commonly connected to the common input line 201, and a source connected to the gate of the auxiliary pull-down NMOS transistor MN10. The fourth PMOS transistor MP9 may have a source connected to the common input line 201, a gate connected to the first node N6, and a drain connected to the gate of the auxiliary pull-down NMOS transistor MN10. The fourth NMOS transistor MN13 may have a drain and a gate commonly connected to the first node N6, and a source connected to the gate of the auxiliary pull-down NMOS transistor MN10. The third PMOS transistor MP8, the third NMOS transistor MN14, the fourth PMOS transistor MP9, the fourth NMOS transistor MN13 and the auxiliary pull-down NMOS transistor MN10 may be connected to a fifth node N10.

Figure 6:
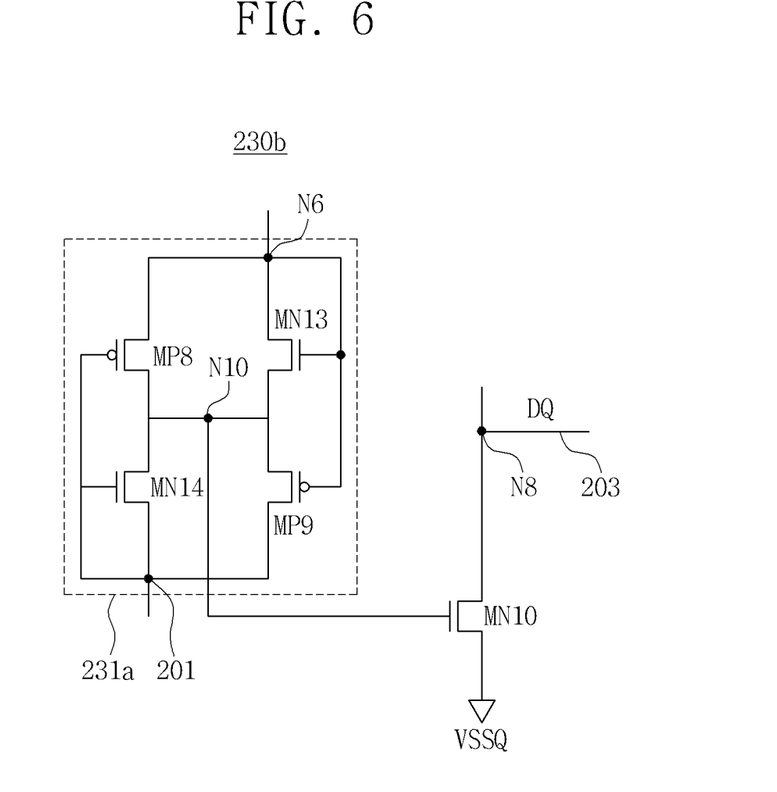
FIG. 6 is a circuit diagram illustrating a noise canceller included in the output driving circuit of FIG. 4, in accordance with another embodiment.

FIG. 6 is a circuit diagram illustrating another exemplary noise canceller 230 included in the output driving circuit 200 of FIG. 4, in accordance with another embodiment.

Referring to FIG. 6, the noise canceller 230b may include an auxiliary pull-down NMOS transistor MN10 and a driving control circuit 231a.

The auxiliary pull-down NMOS transistor MN10 may have a source connected to the ground voltage VSSQ and a drain connected to the output node N8. The driving control circuit 231a may control the auxiliary pull-down NMOS transistor MN10, and may be electrically connected to the first node N6 and the common input line 201.

The driving control circuit 231a may include a third PMOS transistor MP8, a third NMOS transistor MN14, a fourth PMOS transistor MP9 and a fourth NMOS transistor MN13.

The third PMOS transistor MP8 may have a source connected to the first node N6, a gate connected to the common input line 201, and a drain connected to a gate of the auxiliary pull-down NMOS transistor MN10. The third NMOS transistor MN14 may have a gate and a drain commonly connected to the common input line 201, and a source connected to the gate of the auxiliary pull-down NMOS transistor MN10. The fourth PMOS transistor MP9 may have a source connected to the common input line 201, a gate connected to the first node N6, and a drain connected to the gate of the auxiliary pull-down NMOS transistor MN10. The fourth NMOS transistor MN13 may have a drain and a gate commonly connected to the first node N6, and a source connected to the gate of the auxiliary pull-down NMOS transistor MN10. The third PMOS transistor MP8, the third NMOS transistor MN14, the fourth PMOS transistor MP9, the fourth NMOS transistor MN13 and the auxiliary pull-down NMOS transistor MN10 may be connected to a fifth node N10.

Figure 7:
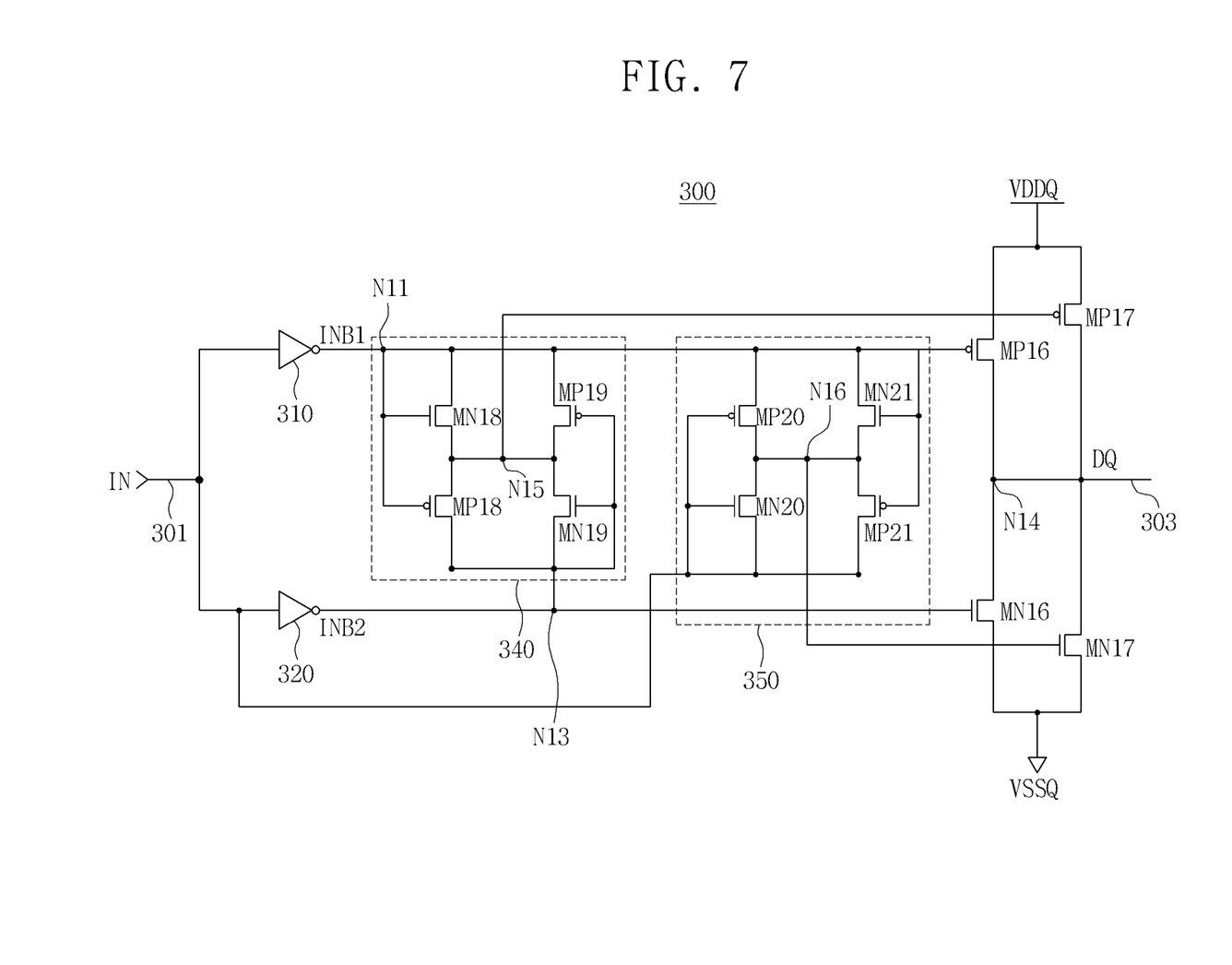
FIG. 7 is a circuit diagram of an output driving circuit in accordance with still another embodiment.

FIG. 7 is a circuit diagram of an output driving circuit 300 in accordance with still another embodiment.

Referring to FIG. 7, the output driving circuit 300 may include a first buffer 310, a second buffer 320, a pull-up PMOS transistor MP16, a pull-down NMOS transistor MN16 and a noise canceller. The noise canceller may include an auxiliary pull-up PMOS transistor MP17, an auxiliary pull-down NMOS transistor MN17, a first driving control circuit 340 and a second driving control circuit 350.

The first buffer 310 may receive an input signal IN through a common input line 301, buffer the input signal IN to generate a first control signal INB1, and output the first control signal INB1 to a first node N11. The second buffer 320 may receive the input signal IN through the input line 301, buffer the first input signal IN to generate a second control signal INB2, and output the second control signal INB2 to a second node N13. For example, the first buffer 310 may include an inverter, and may invert a phase of the input signal IN to generate the first control signal INB1. The second buffer 320 may include an inverter, and may invert a phase of the input signal IN to generate the second control signal INB2.

The pull-up PMOS transistor MP16 may electrically connect a supply voltage VDDQ to an output node N14 in response to the first control signal INB1 of the first node N11. The pull-down NMOS transistor 16 may electrically connect a ground voltage VSSQ to the output node N14 in response to the second control signal INB2 of the second node N13. The noise canceller may form a current path between the output node N14 and the ground voltage VSSQ to decrease noise of an output signal DQ when the pull-up PMOS transistor MP16 is in an on state and the pull-down NMOS transistor MN16 is in an off state. The noise canceller may be electrically connected to the first node N11, the second node N13, an input terminal of the second buffer 320 and the output node N14. The output signal DQ may be output to an exterior through an output line 303.

The auxiliary pull-up PMOS transistor MP17 may have a source connected to the supply voltage VDDQ and a drain connected to the output node N14. The auxiliary pull-down NMOS transistor MN17 may have a source connected to the ground voltage VSSQ and a drain connected to the output node N14. The first driving control circuit 340 may control the auxiliary pull-up PMOS transistor MP17, and may be electrically connected to the first node N11 and the input terminal of the second buffer 320. The second driving control circuit 350 may control the auxiliary pull-down NMOS transistor MN17, and may be electrically connected to the first node N11 and the common input line 301.

The first driving control circuit 340 may include a first PMOS transistor MP18, a first NMOS transistor MN18, a second PMOS transistor MP19 and a second NMOS transistor MN19.

The first PMOS transistor MP18 may have a drain connected to the second node N13, a gate connected to the first node N11, and a source connected to a gate of the auxiliary pull-up PMOS transistor MP17. The first NMOS transistor MN18 may have a gate and a drain connected to the first node N11, and a source connected to the gate of the auxiliary pull-up PMOS transistor MP17. The second PMOS transistor MP19 may have a drain connected to the first node N11, a gate connected to the second node N13, and a source connected to the gate of the auxiliary pull-up PMOS transistor MP17. The second NMOS transistor MN19 may have a gate and a drain commonly connected to the second node N13, and a source connected to the gate of the auxiliary pull-up PMOS transistor MP17. The first PMOS transistor MP18 and the second NMOS transistor MN19 are connected to the second node N13.

The second driving control circuit 350 may include a third PMOS transistor MP20, a third NMOS transistor MN20, a fourth PMOS transistor MP21 and a fourth NMOS transistor MN21.

The third PMOS transistor MP20 may have a source connected to the first node N11, a gate connected to the input terminal of the second buffer 320, and a drain connected to a gate of the auxiliary pull-down NMOS transistor MN17. The third NMOS transistor MN20 may have a gate and a drain commonly connected to the input terminal of the second buffer 320, and a source connected to the gate of the auxiliary pull-down NMOS transistor MN17. The fourth PMOS transistor MP21 may have a source connected to the input terminal of the second buffer 320, a gate connected to the first node N11, and a drain connected to the gate of the auxiliary pull-down NMOS transistor MN17. The fourth NMOS transistor MN21 may have a drain and a gate commonly connected to the first node N11, and a source connected to the gate of the auxiliary pull-down NMOS transistor MN17.

In one embodiment, the magnitude of a current flowing through the auxiliary pull-down NMOS transistor MN17 when the pull-up PMOS transistor MP16 is in an on state, is configured to be smaller than the magnitude of a current flowing through the pull-down NMOS transistor MN16 when the pull-down NMOS transistor MN16 is in an on state.

In one embodiment, the ratio of the magnitude of a current flowing through the pull-down NMOS transistor MN16 when the pull-down NMOS transistor MN16 is in an on state and a current flowing through the auxiliary pull-down NMOS transistor MN17 when the pull-up PMOS transistor MP16 is in an on state, may be 97:3.

In one embodiment, the size (e.g., Width/Length) of the auxiliary pull-down NMOS transistor MN17 is smaller than the size of the pull-down NMOS transistor MN16, in a semiconductor integrated circuit.

Figure 8:
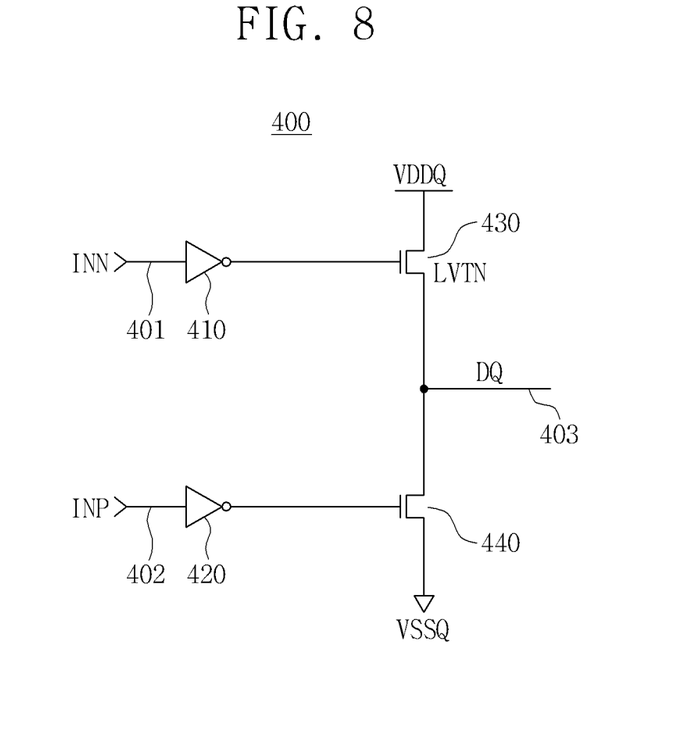
FIG. 8 is a circuit diagram of an output driving circuit in accordance with yet another embodiment.

FIG. 8 is a circuit diagram of an output driving circuit 400 in accordance with yet another embodiment Referring to FIG. 8, the output driving circuit 400 includes a first buffer 410, a second buffer 420, a pull-up NMOS transistor (LVTN) 430 and a pull-down NMOS transistor 440.

The first buffer 410 may receive a first input signal INN through an input line 401, and buffer the first input signal INN. The second buffer 420 may receive a second input signal INP having an opposite phase of the first input signal INN through an input line 402, and buffer the second input signal INP having an opposite phase of the first input signal INN. In the example of FIG. 8, the first buffer 410 may include an inverter, and may invert a phase of the first input signal INN. The second buffer 420 may include an inverter, and may invert a phase of the second input signal INP.

The pull-up NMOS transistor 430 may have a lower threshold voltage (LNTN) than that of the pull-down NMOS transistor 440, and may electrically connect a supply voltage VDDQ to an output line 403 in response to an output signal of the first buffer 410. The pull-down NMOS transistor 440 may electrically connect a ground voltage VSSQ to the output line 403 in response to an output signal of the second buffer 420. The output signal DQ may be output to an exterior through the output line 403.

Figure 9:
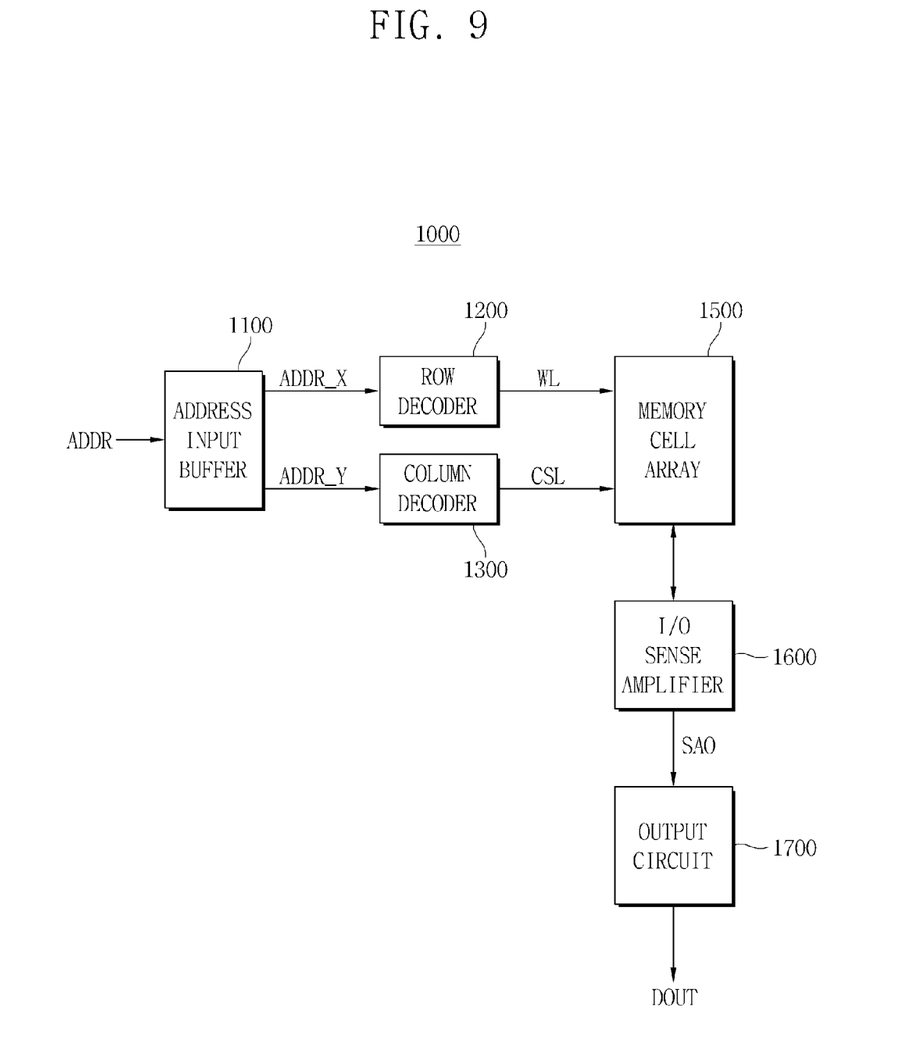
FIG. 9 is a block diagram of an example of a semiconductor memory device including the output driving circuit in accordance with some embodiments.

FIG. 9 is a block diagram of an example of a semiconductor memory device 1000 including the output driving circuit in accordance to example embodiments.

Referring to FIG. 9, the semiconductor memory device 1000 includes a memory cell array 1500 configured to operate in response to a word line enable signal WL and a column selecting signal CSL, an address input buffer 1100, a row decoder 1200, a column decoder 1300, an input/output (I/O) sense amplifier 1600 and an output circuit 1700.

The address input buffer 1100 generates a row address signal ADDR_X and a column address signal ADDR_Y based on an external address. The row decoder 1200 decodes the row address signal ADDR_X to generate the word line enable signal WL. The column decoder 1300 decodes the column address signal ADDR_Y to generate the column selecting signal CSL. The I/O sense amplifier 1600 amplifies data output from the memory cell array 1500 to generate first data SAO, and transfers data received from an exterior to the memory cell array 1500.

The output circuit 1700 may include an output driving circuit according to above disclosed embodiments. The output circuit 1700 may decrease noise of an output signal to generate output data by forming a current path between the output node and the ground voltage when a pull-up transistor is in an on state and a pull-down transistor is in an off state. The semiconductor memory device 1000 may be implemented, for example, on a semiconductor chip or stack of semiconductor chips.

Figure 10:
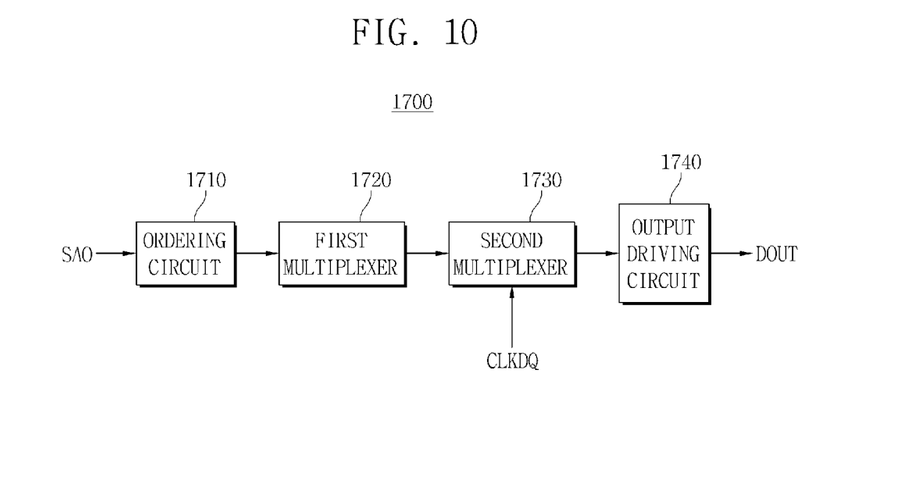
FIG. 10 is a block diagram illustrating the output circuit included in the semiconductor memory device of FIG. 9 in accordance with one embodiment.

FIG. 10 is a block diagram illustrating the output circuit 1700 included in the semiconductor memory device 1000 of FIG. 9 in accordance with one embodiment.

Referring to FIG. 10, the output circuit 1700 may include an ordering circuit 1710, a first multiplexer 1720, a second multiplexer 1730 and an output driving circuit 1740.

The ordering circuit 1710 determines an output order of the first data SAO. The first multiplexer 1720 selects an output bit structure, and outputs second data in response to an output signal of the ordering circuit 1710. The second multiplexer 1730 performs a parallel-serial conversion to generate third data in response to an output clock signal CLKDQ. The output driving circuit 1740 forms a current path between the output node and the ground voltage when a pull-up transistor is in an on state and a pull-down transistor is in an off state, and generates output data based on the third data.

The semiconductor memory device 1000 of FIG. 9 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a plurality of and/or a combination of thereof.

Figure 11:
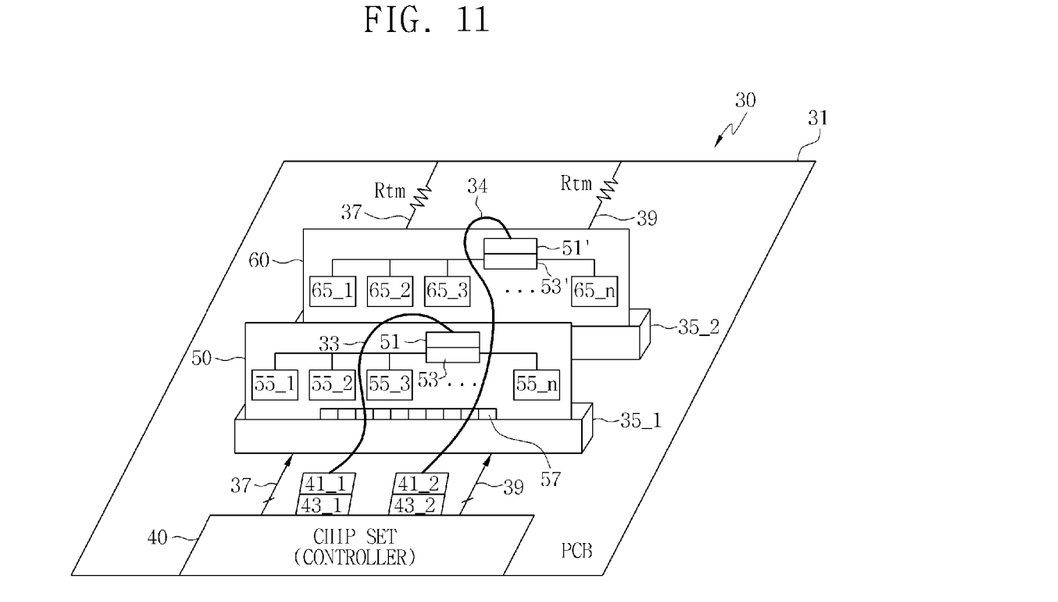
FIG. 11 is a diagram of an example of a memory system including a semiconductor memory device in accordance with embodiments of the inventive concepts.

FIG. 11 is a diagram of an example of a memory system 30 including a semiconductor memory device in accordance with some example embodiments.

Referring to FIG. 11, the memory system 30 may include a motherboard 31, a chip set (or a controller) 40, slots 35_1 and 35_2, memory modules 50 and 60, and transmission lines 33 and 34. Buses 37 and 39 connect the chip set 40 with the slots 35_1 and 35_2. A terminal resistor Rtm may terminate each of the buses 37 and 39 on a PCB of the motherboard 31.

For convenience, in FIG. 11, only two slots 35_1 and 35_2 and two memory modules 50 and 60 are shown. However, the memory system 30 may include an arbitrary number of slots and memory modules.

The chip set 40 may be mounted on the PCB of the motherboard 31, and control the operation of the memory system 30. The chip set 40 may include connectors 41_1 and 41_2 and converters 43_1 and 43_2.

The converter 43_1 receives parallel data generated by the chip set 40, converts the parallel data to serial data, and outputs the serial data to the transmission line 33 via the connector 41_1. The converter 43_1 receives serial data via the transmission line 33, converts the serial data to parallel data, and outputs the parallel data to the chip set 40.

The converter 43_2 receives parallel data generated by the chip set 40, converts the parallel data to serial data, and outputs the serial data to the transmission line 34 via the connector 41_2. The converter 43_2 receives serial data via the transmission line 34, converts the serial data to parallel data, and outputs the parallel data to the chip set 40. The transmission lines 33 and 34 included in the memory system 30 may be a plurality of optical fibers.

The memory module 50 may include a plurality of memory devices 55_1 to 55_n, a first connector 57, a second connector 51, and a converter 53. The memory module 60 may include a plurality of memory devices 65_1 to 65_n, a first connector 57', a second connector 51', and a converter 53'.

The first connector 57 may transfer low-speed signals received from the chip set 40 to the memory devices 55_1 to 55_n, and the second connector 51 may be connected to the transmission line 33 for transferring high-speed signals.

The converter 53 receives serial data via the second connector 51, converts the serial data to parallel data, and outputs the parallel data to the memory devices 55_1 to 55_n. Further, the converter 53 receives parallel data from the memory devices 55_1 to 55_n, converts the parallel data to serial data, and outputs the serial data to the second connector 51.

The memory devices 55_1 to 55_n and 65_1 to 65_n included in FIG. 11 may include a semiconductor memory device according to embodiments of the inventive concepts. Therefore, the memory devices 55_1 to 55_n and 65_1 to 65_n may include an output circuit according to embodiments of the inventive concepts. The output circuit included in the memory devices 55_1 to 55_n and 65_1 to 65_n may form a current path between the output node and the ground voltage when a pull-up transistor is in an on state and a pull-down transistor is in an off state, and generate output data based on the third data.

The memory devices 55_1 to 55_n and 65_1 to 65_n may be a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 12:
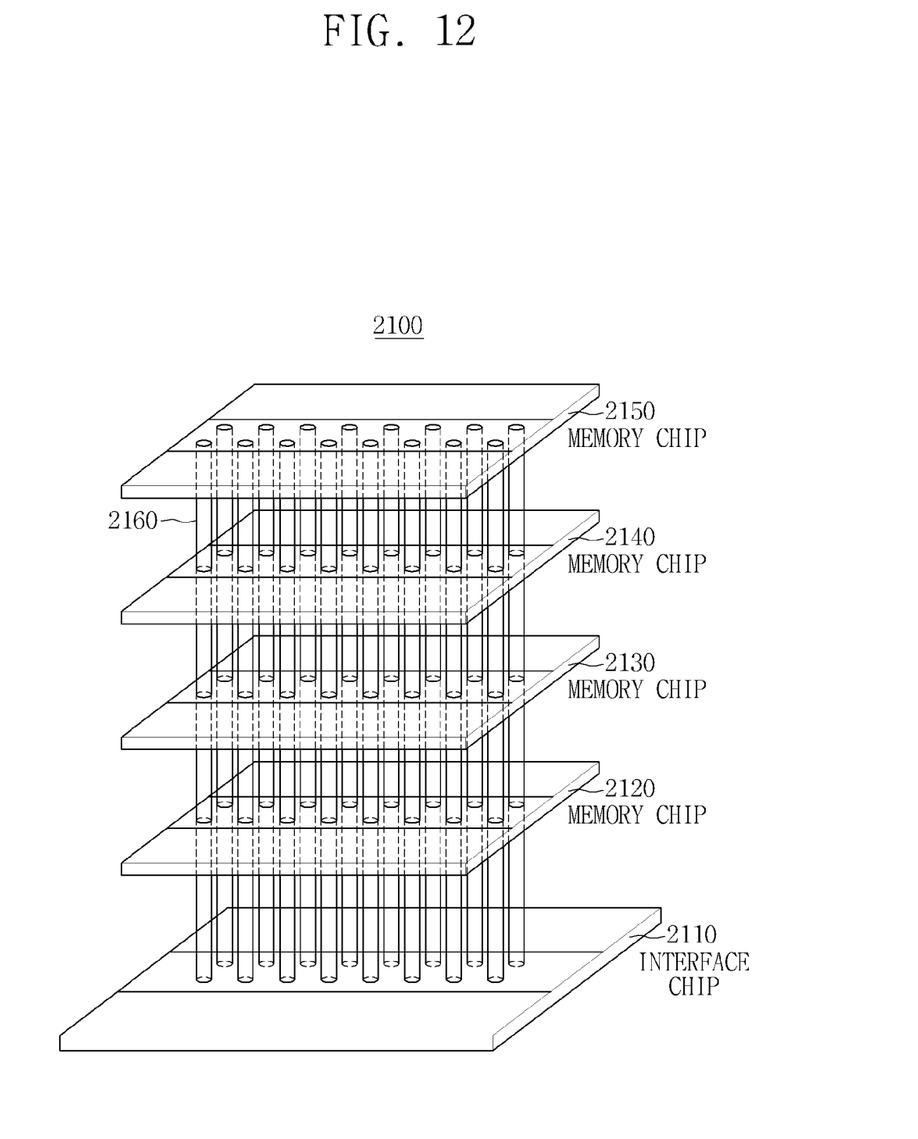
FIG. 12 is a diagram of an example of a stacked semiconductor device including a semiconductor memory device in accordance with some embodiments.

FIG. 12 is a diagram of an example of a stacked semiconductor device 2100 including a semiconductor memory device 1000 according to some example embodiments.

Referring to FIG. 12, the stacked semiconductor device 2100 may include a plurality of chips including an interface chip 2110, and memory chips 2120, 2130, 2140 and 2150 which are electrically connected through-substrate vias (e.g., through through-silicon vias) 2160. Although through-silicon vias 2160 disposed in two rows are shown in FIG. 12, the stack semiconductor device 2100 may include any number of through-silicon vias.

The memory chips 2120, 2130, 2140 and 2150 included in the stacked semiconductor device 2100 may include the refresh circuit in accordance with the embodiments as described above. The interface chip 2110 interfaces between the memory chips 2120, 2130, 2140 and 2150 and external devices.

Figure 13:
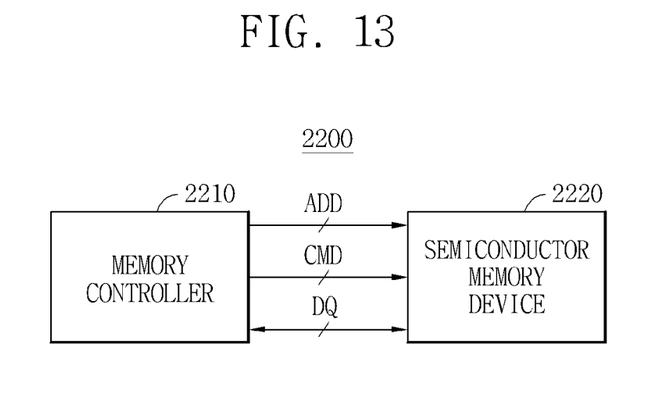
FIG. 13 is a block diagram of another example of a memory system including a semiconductor memory device in accordance with some embodiments.

FIG. 13 is a block diagram of another example of a memory system 2200 including a semiconductor memory device in accordance with some example embodiments.

Referring to FIG. 13, the memory system 2200 includes a memory controller 2210 and a semiconductor memory device 2220.

The memory controller 2210 generates address signals ADD and command signals CMD, and provides the address signals ADD and the command signals CMD to the semiconductor memory device 2220 through buses. Data DQ may be transmitted from the memory controller 2210 to the semiconductor memory device 2220 through the buses, or transmitted from the stacked semiconductor memory device 2220 to the memory controller 2210 through the buses.

The semiconductor memory device 2220 in accordance with above disclosed embodiments may include an output circuit capable of decreasing noise. The output circuit may form a current path between the output node and the ground voltage when a pull-up transistor is in an on state and a pull-down transistor is in an off state, and generate output data.

Figure 14:
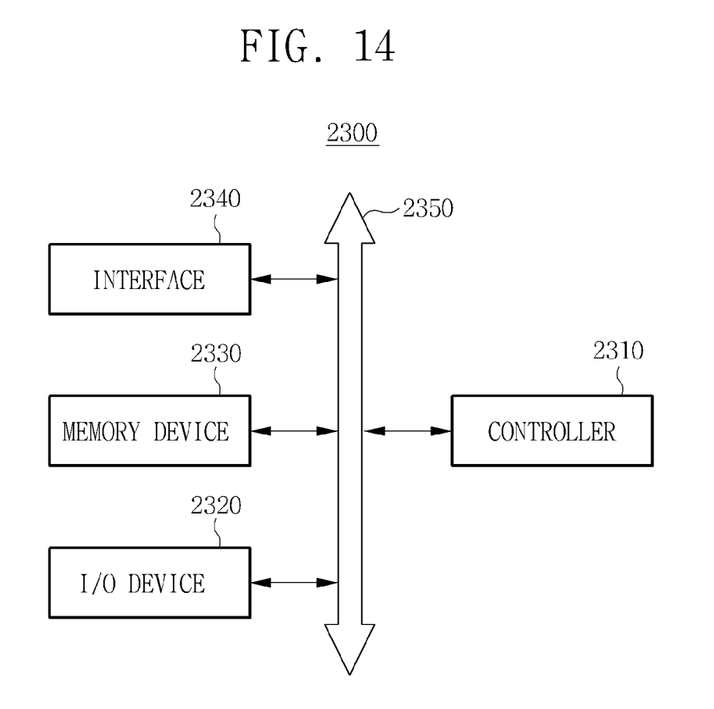
FIG. 14 is a block diagram of an example of an electronic system including a semiconductor memory device in accordance with some embodiments.

FIG. 14 is a block diagram of an example of an electronic system 2300 including a semiconductor memory device in accordance with some example embodiments.

Referring to FIG. 14, the electronic system 2300 in accordance with embodiments of the inventive concepts may include a controller 2310, an input and output device 2320, a memory device 2330, an interface 2340, and a bus 2350. The memory device 2330 may be a semiconductor memory device including the refresh circuit in accordance with above disclosed embodiments. The bus 2350 may function to provide a path in which data is mutually moved among the controller 2310, the input and output device 2320, the memory device 2330, and the interface 2340.

The controller 2310 may include any one of logic devices that can perform functions of at least one of a microprocessor, a digital signal processer, and a microcontroller, or functions similar to those. The input and output device 2320 may include at least one selected from a key pad, key board, and a display device. The memory device 2330 may function to store data and/or instructions performed by the controller 2310.

The memory device 2330 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

The interface 2340 may function to transmit/receive data to/from a communication network. The interface 2340 can include an antenna, wired or wireless transceivers or the like, to transmit and receive data by wires or wirelessly. In addition, the interface 2340 can include optical fibers to transmit and receive data through the optical fibers. The electronic system 2300 may be further provided with an application chipset, a camera image processor, and an input and output device.

The electronic system 2300 may be implemented as a mobile system, personal computer, an industrial computer, or a logic system that can perform various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 2300 is an apparatus that can perform wireless communication, the electronic system 2300 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

According to some embodiments may be applied to a semiconductor memory device and a memory system including the semiconductor memory device.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the following claims. In the claims, means-plus-function clauses are intended to cover the structures described herein as performing the recited function, and not only structural equivalents but also equivalent structures.

What is claimed is:

1. An output driving circuit, comprising:
   a first buffer configured to generate a first control signal at a first node in response to a first input signal;
   a second buffer configured to generate a second control signal at a second node in response to a second input signal having an opposite phase of the first input signal;
   a pull-up transistor configured to generate a first output signal at an output node, and electrically connect a supply voltage to the output node in response to the first control signal;
   a pull-down transistor configured to generate a second output signal at the output node, and electrically connect a ground voltage to the output node in response to the second control signal; and
   a noise canceller configured to form a current path between the output node and the ground voltage to decrease noise of the first output signal when the pull-up transistor is in an on state and the pull-down transistor is in an off state,
   wherein the noise canceller is electrically connected to the first node, the second node, and the output node,
   wherein the pull-down transistor is an NMOS transistor,
   wherein the pull-up transistor is an NMOS transistor configured to have a lower threshold voltage than that of the pull-down NMOS transistor, or the pull-up transistor is a PMOS transistor, and
   wherein the noise canceller comprises:
   an auxiliary pull-down NMOS transistor having a source connected to the ground voltage and a drain connected to the output node; and
   a driving control circuit electrically connected to the first node and the second node, and configured to control the auxiliary pull-down NMOS transistor in response to the first and second control signals.

2. The output driving circuit according to claim 1, wherein the driving control circuit comprises:
   a first PMOS transistor having a source connected to the first node, a gate connected to the second node, and a drain connected to a gate of the auxiliary pull-down NMOS transistor;
   a first NMOS transistor having a gate and a source commonly connected to the second node, and a drain connected to the gate of the auxiliary pull-down NMOS transistor;
   a second PMOS transistor having a source connected to the second node, a gate connected to the first node, and a drain connected to the gate of the auxiliary pull-down NMOS transistor; and
   a second NMOS transistor having a source and a gate commonly connected to the first node, and a drain connected to the gate of the auxiliary pull-down NMOS transistor.

3. The output driving circuit according to claim wherein driving capability of the auxiliary pull-down NMOS transistor is smaller than driving capability of the pull-down NMOS transistor.

4. The output driving circuit according to claim 3, wherein the driving capability of the auxiliary pull-down NMOS transistor is smaller than 10% of the driving capability of the pull-down NMOS transistor.

* * * * *